United States Patent
Shi et al.

(10) Patent No.: US 9,219,226 B2
(45) Date of Patent: Dec. 22, 2015

(54) SPIN VALVES USING ORGANIC SPACERS AND SPIN-ORGANIC LIGHT-EMITTING STRUCTURES USING FERROMAGNETIC ELECTRODES

(71) Applicant: The University of Utah Research Foundation, Salt Lake City, UT (US)

(72) Inventors: Jing Shi, Salt Lake City, UT (US); Valy Vardeny, Salt Lake City, UT (US)

(73) Assignee: THE UNIVERSITY OF UTAH RESEARCH FOUNDATION, Salt Lake City, UT (US)

( * ) Notice: Subject to any disclaimer, the term of this patent is extended or adjusted under 35 U.S.C. 154(b) by 95 days.

(21) Appl. No.: 13/851,537

(22) Filed: Mar. 27, 2013

(65) Prior Publication Data

US 2013/0299786 A1    Nov. 14, 2013

Related U.S. Application Data

(63) Continuation of application No. 10/557,665, filed as application No. PCT/US2004/016156 on May 24, 2004, now abandoned.

(60) Provisional application No. 60/472,640, filed on May 22, 2003.

(51) Int. Cl.

| | |
|---|---|
| H01L 43/10 | (2006.01) |
| G01R 33/09 | (2006.01) |
| B82Y 10/00 | (2011.01) |
| B82Y 25/00 | (2011.01) |
| G11B 5/29 | (2006.01) |
| G11B 5/31 | (2006.01) |
| G11C 11/16 | (2006.01) |
| H01F 10/00 | (2006.01) |
| H01F 10/32 | (2006.01) |
| H01L 43/08 | (2006.01) |
| H01L 43/12 | (2006.01) |
| G11B 5/39 | (2006.01) |
| H01F 10/193 | (2006.01) |

(52) U.S. Cl.
CPC ............... *H01L 43/10* (2013.01); *B82Y 10/00* (2013.01); *B82Y 25/00* (2013.01); *G01R 33/091* (2013.01); *G11B 5/29* (2013.01); *G11B 5/31* (2013.01); *G11C 11/16* (2013.01); *H01F 10/005* (2013.01); *H01F 10/3213* (2013.01); *H01F 10/3254* (2013.01); *H01F 10/3268* (2013.01); *H01F 10/3281* (2013.01); *H01L 43/08* (2013.01); *H01L 43/12* (2013.01); *G11B 5/3906* (2013.01); *H01F 10/1936* (2013.01); *Y10T 428/1107* (2015.01)

(58) Field of Classification Search
None
See application file for complete search history.

(56) References Cited

U.S. PATENT DOCUMENTS

| | | | | |
|---|---|---|---|---|
| 6,153,318 | A  * | 11/2000 | Rothberg | ........................ 428/821 |
| 2003/0001154 | A1* | 1/2003 | Epstein et al. | ................... 257/40 |

* cited by examiner

*Primary Examiner* — Kevin Bernatz
(74) *Attorney, Agent, or Firm* — Stoel Rives LLP

(57) ABSTRACT

The spacer in a spin-valve is replaced with an organic layer, allowing for numerous applications, including light-emitting structures. The invention demonstrates that the spin coherence of the organic material is sufficiently long that the carriers do not lose their spin memory even in traversing a thicker passive barrier. At least three methods to fabricate the organic spin-valve devices are disclosed, in which the difficulties associated with depositing the ferromagnetic (FM) and organic layers are addressed.

20 Claims, 2 Drawing Sheets

SPIN VALVES USING ORGANIC SPACERS AND SPIN-ORGANIC LIGHT-EMITTING STRUCTURES USING FERROMAGNETIC ELECTRODES

CROSS-REFERENCE TO RELATED APPLICATIONS

This application is a continuation of U.S. application Ser. No. 10/557,665, which was the National Stage of International Application No. PCT/US04/16156, filed May 24, 2004; International Application No. PCT/US04/16156 claims the benefit of U.S. Provisional Application No. 60/472,640, filed May 22, 2003; the contents of all three applications are incorporated by reference herein in their entirety.

STATEMENT REGARDING FEDERALLY SPONSORED RESEARCH

This invention was made with government support under ECS0204978 awarded by the National Science Foundation. The government has certain rights in the invention.

FIELD OF THE INVENTION

This invention relates generally to spin vales and, more particularly, to spin valves incorporating an organic spacer.

BACKGROUND OF THE INVENTION

Spin-valves based on the effect of giant magnetoresistance and tunneling magnetoresistance are currently used in high-density magnetic recording heads and magnetoresistive random-access memories. This type of device is based on electrical resistance having two different values; say $R_1$ and $R_2$ that are dependent on an applied external magnetic field. When a magnetic head is in proximity to the spin-valve device it can change the resistance, or it can change voltage if an electric current runs through the device, between the two resistance values $R_1$ and $R_2$. The change in electrical resistance does not involve extra current or voltage; it just reacts to the external magnetic field. A spin-valve can be regarded as a switch, wherein the application of an external magnetic field does the switching.

A conventional vertical spin-valve device can be constructed using two thin ferromagnetic layers (each with a thickness of less than 100 nm) and a spacer in between, which can be a metallic or insulating thin layer (a few nm thick). When the magnetization orientation in the two adjacent ferromagnetic electrodes is parallel to each other, the electrical resistance measured perpendicular to the films has value $R_1$; alternatively, when the two magnetization orientations of the two ferromagnetic films are anti-parallel to each other then the resistance is $R_2$, which is different than $R_1$. The magnetization of the electrodes can be arranged to be parallel or anti-parallel to each other by an external magnetic field. The resistance change under the influence of the magnetic field has been dubbed magnetoresistance or MR.

SUMMARY OF THE INVENTION

Broadly according to this invention, the spacer in a spin-valve is replaced with an organic layer. However, the thickness of the layer is not limited, allowing for numerous applications, including light-emitting structures. The invention demonstrates that the spin coherence of the organic material is sufficiently long that the carriers do not lose their spin memory even in traversing a thicker passive barrier. At least three methods to fabricate the organic spin-valve devices are disclosed, in which the difficulties associated with depositing the ferromagnetic (FM) and organic layers are addressed.

The Advantages of organic spin-valves over existing inorganic spin-valves are many. First, they are less expensive and easier to fabricate than their inorganic counterparts. There are also many more choices for the materials that make up the organic spacer. As examples, an intermediate layer may be chosen that emits light, changes its electrical properties upon illumination, can be doped in situ, and is sensitive to environmental physical and chemical properties such as humidity, oxygen level, and other environmental factors.

DETAILED DESCRIPTION OF THE INVENTION

Figure 1:
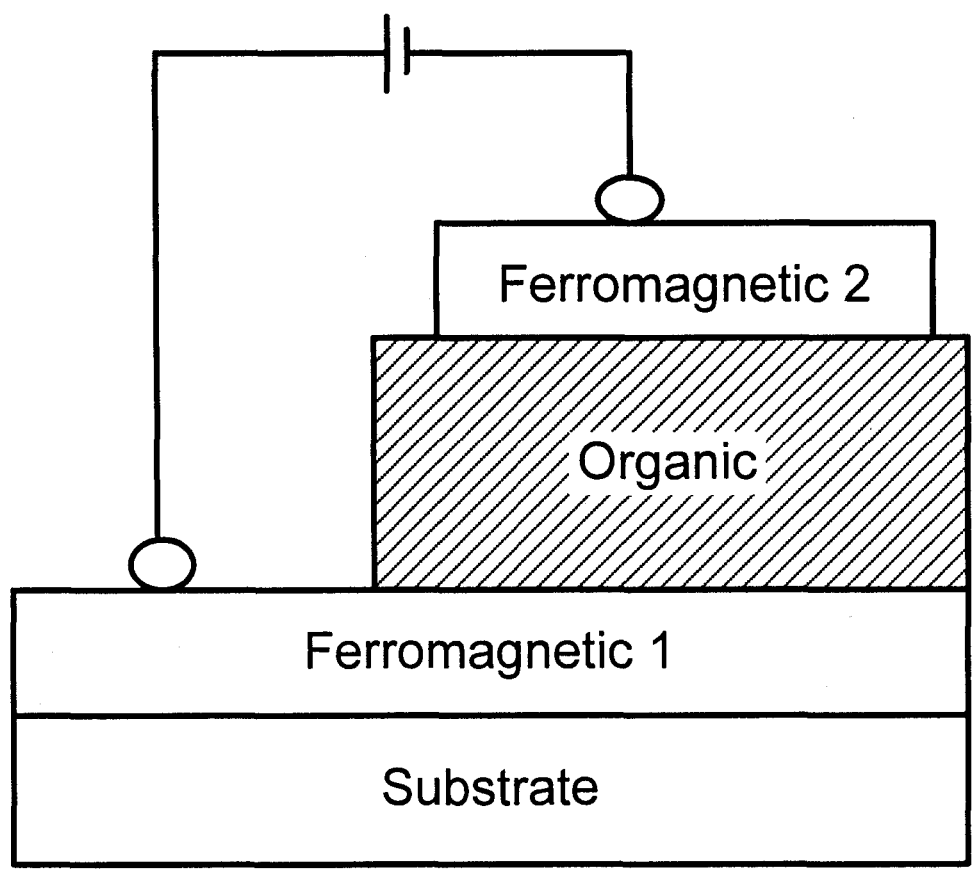
FIG. 1 shows a spin valve constructed in accordance with this invention.
Figure 2:
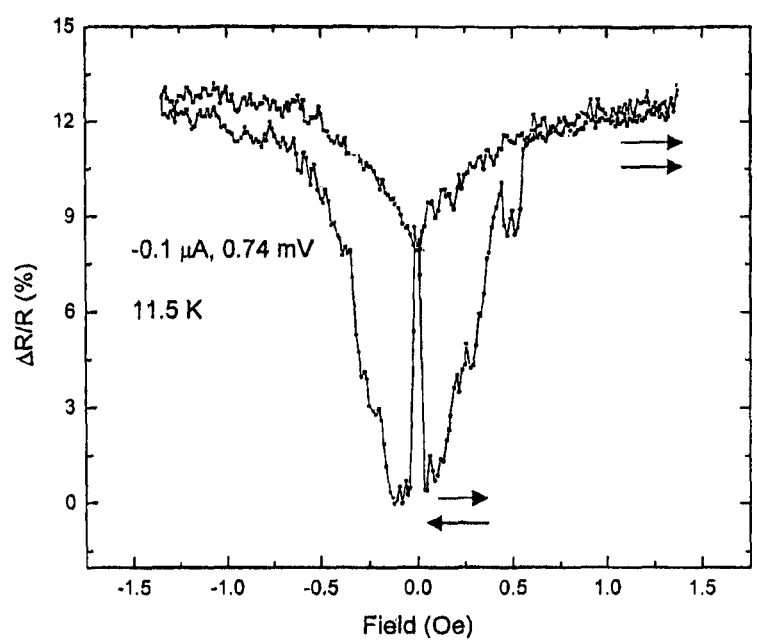
FIG. 2 is a graph that demonstrates a substantial magnetoresistance effect based upon a device constructed in accordance with this invention.

FIG. 1 shows a spin valve constructed in accordance with this invention. There are three important layers in this device, namely the two ferromagnetic electrodes (FM1 and FM2), and an organic layer as a spacer. The device may be built on any suitable substrate material. The ferromagnetic electrodes can be metallic (e.g. Co, Ni, Fe or their alloys), half-metallic (e.g. ReMnO$_3$, Re being a rare earth element, or CrO$_2$), or semiconducting (e.g. GaMnAs). The organic layer can incorporate π-conjugated semiconductor polymers or small molecules (e.g. Alq$_3$). In the vertical spin-valve devices that we have demonstrated so far, FM1 was a ferromagnetic oxide, La$_{0.7}$Sr$_{0.3}$MnO$_3$, (LSMO); FM2 was a composite layer consisting of Co and Al; whereas the organic semiconductor was Alq$_3$. We have fabricated and realized a large MR in this device (FIG. 2).

Similar spin-valve devices can be realized in planar geometry, in which FM1 and FM2 electrodes may be the same material but need to have different widths in order to control the magnetization switching in each electrode independently. According to this embodiment, we fabricated a vertical device based on two different FM electrodes. In addition, we have also fabricated the spin-valve device and demonstrated its switching capability upon the application of an external magnetic field.

In the vertical organic spin-valve devices, the ferromagnetic layers are typically high-melting temperature material, whereas the organic semiconducting layer has typically low melting temperature. Accordingly, during the FM electrode deposition process, the deposition temperature needs to be much lower than the melting point of the organic materials if the organic materials have been already deposited. Higher temperatures may evaporate the organic film away or cause intermixing between the organic and FM materials that would deteriorate their internal magnetization. As a result the intermixing at the FM/organic interfaces may destroy the magnetoresistance.

In addition, the metallic ferromagnetic electrodes typically oxidize very fast in air. The oxidized interfaces are detrimental to magnetoresistance in the final devices. So it is advantageous to fabricate the metallic electrodes together with the organic semiconductors in vacuum. Sputtering (a common deposition technique) is not preferred for the metallic electrode deposition if the organic layer is already deposited because the plasma is detrimental to the organic semiconductors. Thus, the film deposition is preferably carried out in vacuum at low temperatures. For some spin-injecting electrodes such as the ferromagnetic oxides (e.g. LSMO), in-situ deposition is not required in fabricating the organic spin-valve since they do not react with $O_2$ in air. They can be predeposited, cleaned and then introduced into the vacuum chamber prior to the organic and the second electrode deposition.

Fabrication Methods

In the following we describe various alternative fabrication methods for the organic spin-valve.

Method 1

In this method the first layer, FM1 is a predeposited ferromagnetic electrode that is not air sensitive, the organic layer is deposited on FM1 by thermal evaporation at a relatively low temperature, whereas the deposition of the second ferromagnetic layer, FM2 is done by thermal evaporation with cooled substrates and/or with a cooled region near the evaporation source so that the excess heat can be taken away. This ensures that the vacuum chamber is at a sufficiently low temperature that the deposited organic layer will not evaporate away or intermix with FM2 at the interface. The thermal evaporation of FM2 can be replaced with electron-beam evaporation, which typically produces less heat if the evaporation is from a focused spot.

Method 2

A second method can be independently used or used together with the first method. The main idea is to deposit a very thin FM2 layer (thickness of the order of few nm) onto the organic layer so that the high deposition temperature will be needed for a relatively short time. We note that a very thin layer (~1 nm or so) of ferromagnetic material is already adequate to establish its ferromagnetism at the interface in order to produce the magnetoresistance. Since a very thin FM2 layer is deposited then if one starts with relatively thick organic layer, some of it would evaporate away during the FM2 layer deposition, but some would remain deposited on the first predeposited FM1 layer. To ensure the device electrical connection and to protect the relatively thin FM2 layer, a low melting temperature metal (e.g. Al, Au) is evaporated on top of FM2.

For demonstrating the organic spin valve we have used the second method. The predeposited FM1 layer was a LSMO ferromagnetic film. We deposited 120 nm thick film of the π-conjugated organic molecule $AlQ_3$ (purchased from Aldrich), and FM2 layer was a 3.5 nm thick of cobalt. A protective layer of aluminum was then deposited onto FM2. The magnetization properties of the ferromagnetic layers FM1 and FM2 were separately measured by magneto-optical technique (MOKE) and the temperature dependence of the magnetization and coercive magnetic field was recorded Method 3

We refer to the third method as a flip/bond method. It can be used independently or together with the above two methods. This method works with either metallic or other ferromagnetic electrodes as FM1 and FM2 layers. Both FM1 and FM2 electrodes are deposited first following by an organic layer deposition in vacuum. Then the electrodes that are already covered with the organic can be taken out of the vacuum chamber. One electrode can be flipped with its organic overlayer facing the other electrode with its own organic overlayer. Then the two organic layers are brought together. The electrodes can be aligned and then bonded by heating up to a relatively low temperature to promote adhesion. This methods ensures low temperature deposition and no intermixing at the metal/organic interfaces Materials The organic vertical spin valve is composed of at least three layers; two ferromagnetic layers and an organic semiconductor layer. Here we mention various possible materials that can be used for this device.

1. Ferromagnetic Layers

These may be metallic, half metallic or magnetic semiconductors. Metallic ferromagnetic may be iron, cobalt, nickel and their composites. The half metallic can be manganites and other magnetic oxides.

2. Organic Semiconductors (π-conjugated)

These can be polymers such as polythiophenes, polyparaphenylenes, polyparaphenylenevynylenes, and polyfluorenes and their block co-polymers. Also they can be small oligomers of the above such as 4-thiophene, 6-thiophen, etc, or 3-PPV, such as distyryl benzene, etc. Also they can be small molecules such as porphyrines, $AlQ_3$, PBD, dendrimers, etc.

In summary, we have fabricated and demonstrated an organic spin-valve device. In addition, we have also successfully shown that carriers (electron and/or holes) with aligned spins can be injected into and transported coherently through π-conjugated organic semiconductor films. This opens up a new field with opportunities to add new functionalities to the existing spin-devices or develop entirely new devices.

Other Applications (a) The resistance of the organic spin-valves can be tuned. This may be carried out by engineering the HOMO-LUMO levels of the organic semiconductors relative to the ferromagnetic electrode materials. This can have a great impact in magnetic recording and magnetoresistive random access memory technologies.

(b) Since it has been discovered that the organic semiconductors generally have a long spin diffusion length, the organic spacer in the spin-valves can be made relatively thick. This can make the fabrication process much more reproducible and reliable in magnetic read heads and magnetoresistive random-access memory.

(c) The organic layer is a semiconductor; therefore, the conventional spin-valves can be made active with very interesting possibilities.

(i) The spin-valve can be fabricated to show a characteristic I-V response curve of a diode. This can be achieved if the work-functions of the two ferromagnetic electrodes are chosen to be very different from each other. This would eliminate or greatly simplify the complicated and expensive CMOS process used for isolation transistors in the present magnetoresistive random access memory.

(ii) The organic layer may be chosen to emit light. Then using ferromagnetic electrodes, FM1 and FM2 to respectively inject electrons and holes then the organic spin-valve actually is transformed into an organic light emitting diode (OLED), with electroluminescence emission upon application of an external bias voltage. We note that the efficiency of such OLED is greatly enhanced if the spins of the injected electrons and holes are controlled by an external magnetic field. In addition the electroluminescence emission intensity may be controlled by an external magnetic field.

(iii) The electrical characteristic properties, as well as the MR value might be changed upon light illumination.

(iv) Again the electrical properties may be changed upon in situ doping in the gas phase.

We claim:
1. A spin-valve device, comprising:
   (a) a uniform thickness substrate;
   (b) a first ferromagnetic electrode and a second ferromagnetic electrode in a vertically spaced orientation relative to each other and applied to the substrate, with the first ferromagnetic electrode being directly attached to the substrate, and the first and second ferromagnetic electrodes being formed of either
      (1) different materials sufficient to allow the magnetic polarization of each electrode to be controlled independently, or
      (2) the same material but having different widths to allow the magnetic polarization of each electrode to be controlled independently; and
   (c) a π-conjugated organic semiconductor spacer layer positioned between and directly adjacent to the first and second ferromagnetic electrodes;
   wherein the substrate, the first ferromagnetic electrode, the π-conjugated organic semiconductor spacer layer, and the second ferromagnetic electrode are configured in a vertically stacked planar geometry; and
   wherein the device is configured to allow for the passage of spin-polarized charge carriers between the first and second electrodes when the magnetic polarization of the first and second ferromagnetic electrodes are antiparallel, and to block passage of spin-polarized charge carriers when the magnetic polarization of the first and second ferromagnetic electrodes are parallel.

2. The spin-valve device of claim 1, wherein the first and second ferromagnetic electrodes are formed of different materials sufficient to allow the magnetic polarization of each electrode to be controlled independently.

3. The spin-valve device of claim 2, wherein the first ferromagnetic electrode is formed of a ferromagnetic oxide and the second ferromagnetic electrode is formed of a metallic alloy to allow the magnetic polarization of each electrode to be controlled independently.

4. The spin-valve device of claim 3, wherein the first ferromagnetic electrode is formed of $La_{0.7}Sr_{0.3}MnO_3$ (LSMO) and the second ferromagnetic electrode is formed of a Co and Al alloy to allow the magnetic polarization of each electrode to be controlled independently.

5. The spin-valve device of claim 1, wherein the first and second ferromagnetic electrodes are formed of the same material but have different widths to allow the magnetic polarization of each electrode to be controlled independently.

6. The spin-valve device of claim 1, wherein the π-conjugated organic semiconductor is selected from polyparaphenylenes, polyparaphenylenevynylenes, and polyfluorenes, and their block co-polymers.

7. The spin-valve device of claim 1, wherein the π-conjugated organic semiconductor is selected from oligomers including poly p-phenylenevinylene, and distyryl benzene.

8. The spin-valve device of claim 1, wherein the π-conjugated organic semiconductor is selected from porphyrine, tris(8-hydroxyquinoline)aluminum(III) ($AlQ_3$), and Polybutadine.

9. The spin-valve device of claim 1, wherein the thickness of the π-conjugated organic semiconductor spacer layer is 100 nanometers or greater.

10. The spin-valve device of claim 1, wherein
   the first ferromagnetic electrode is formed of LSMO and
   the second ferromagnetic electrode is formed of a Co and Al alloy to allow the magnetic polarization of each electrode to be controlled independently; and
   the π-conjugated organic semiconductor is $AlQ_3$.

11. The spin-valve device of claim 1, wherein
   the first and second ferromagnetic electrodes and π-conjugated organic semiconductor spacer layer are configured to show an I-V response curve characteristic of a diode; and
   the device selectively allows for the passage of spin-polarized charge carriers when the magnetic polarization of the first and second ferromagnetic electrodes are antiparallel, and blockage of spin-polarized charge carriers when the magnetic polarization of the first and second ferromagnetic electrodes are parallel.

12. The spin-valve device of claim 1, wherein
   one or both of the electrodes inject electrons or holes into the π-conjugated organic semiconductor spacer layer to generate an electroluminescence emission upon application of an externally applied bias voltage; and
   the device selectively allows for the passage of spin-polarized charge carriers when the magnetic polarization of the first and second ferromagnetic electrodes are antiparallel, and blockage of spin-polarized charge carriers when the magnetic polarization of the first and second ferromagnetic electrodes are parallel.

13. A method of making the spin-valve device of claim 1, comprising:
   (a) depositing the first ferromagnetic electrode directly on the substrate by any suitable means;
   (b) depositing the π-conjugated organic semiconductor spacer layer on top of the first ferromagnetic electrode by thermal evaporation to form a three-layered stack;
   (c) cooling the three-layered stack; and
   (d) depositing the second ferromagnetic electrode on the cooled three-layered stack by thermal evaporation at a temperature low enough to insure the deposited π-conjugated organic semiconductor spacer layer will not evaporate away or intermix with the material being used to form the second ferromagnetic electrode.

14. A method of making the spin-valve device of claim 1, comprising:
   (a) depositing the first ferromagnetic electrode the substrate by any suitable means;
   (b) depositing the π-conjugated organic semiconductor spacer layer on top of the first ferromagnetic electrode by thermal evaporation to form a three-layered stack; and
   (c) depositing the second ferromagnetic electrode on the three-layered stack by thermal evaporation for a sufficiently short time and at a sufficiently low temperature to insure that the deposited π-conjugated organic semiconductor spacer layer does not completely evaporate away during the deposition of the second ferromagnetic electrode.

15. A method of making the spin-valve device of claim 1, comprising:
   (a) depositing the first ferromagnetic electrode directly on a first substrate by any suitable means;
   (b) separately depositing the second ferromagnetic electrode directly on a second substrate by any suitable means;
   (c) depositing the π-conjugated organic semiconductor spacer layer on top of the first ferromagnetic electrode and separately depositing the π-conjugated organic semiconductor spacer layer on top of the second ferromagnetic electrode by thermal evaporation to form a first three-layered stack comprising the first substrate, the first ferromagnetic electrode and the π-conjugated organic semiconductor spacer layer, and a second three-layered stack comprising the second substrate, the second ferromagnetic electrode and the π-conjugated organic semiconductor spacer layer;

(d) inverting one of the three-layered stacks on the other three-layered stack so that the π-conjugated organic semiconductor spacer layers of each three-layered stack contact one another to form a six-layered stack; and (e) bonding the π-conjugated organic semiconductor spacer layer of the first three-layered stack to the π-conjugated organic semiconductor spacer layer of the second three-layered stack by heating the six-layered stack to a temperature sufficient to promote adhesion between the two adjacent π-conjugated organic semiconductor spacer layers.

16. A spin-valve device, comprising:
(a) a uniform thickness substrate;
(b) a first ferromagnetic electrode formed from LSMO, and a second ferromagnetic electrode formed from an alloy of Co and Al, in a vertically spaced orientation relative to each other and applied to the substrate, with the first ferromagnetic electrode being directly attached to the substrate; and
(c) a π-conjugated organic semiconductor spacer layer formed from AlQ$_3$ and positioned between and directly adjacent to the first and second ferromagnetic electrodes;
wherein the substrate, the first ferromagnetic electrode, the π-conjugated organic semiconductor spacer layer, and the second ferromagnetic electrode are configured in a vertically stacked planar geometry; and
wherein the device selectively allows for the passage of spin-polarized charge carriers between the first and second ferromagnetic electrodes when the magnetic polarization of the first and second ferromagnetic electrodes are antiparallel, and the blockage of spin-polarized charge carriers when the magnetic polarization of the first and second ferromagnetic electrodes are parallel.

17. The spin-valve device of claim 16, wherein the device exhibits a magnetoresistance effect, quantified as a percentage of a ratio of change in resistance to device resistance that ranges between about 13 and 9 for magnetic field values within the ranges of about −1.5 to −0.5 Oersted and about 0.5 to 1.5 Oersted, when measured at about 11.5° K, with a current of about −0.1 μA, under a voltage of about 0.74 mV.

18. A spin-valve device, comprising:
a uniform thickness substrate, a first and second ferromagnetic electrode in a vertically spaced orientation relative to each other applied to the substrate, said first and second ferromagnetic electrodes being formed from different materials sufficient to allow the magnetic polarization of each electrode to be controlled independently, and a π-conjugated organic semiconductor spacer layer between and directly adjacent to said first and second ferromagnetic electrodes;
wherein the substrate, the first ferromagnetic electrode, the π-conjugated organic semiconductor spacer layer, and the second ferromagnetic electrode are configured in a vertically stacked planar geometry; and
wherein the device selectively allows for the passage of spin-polarized charge carriers when the magnetic polarization of the first and second ferromagnetic electrodes are antiparallel, and blockage of spin-polarized charge carriers when the magnetic polarization of the first and second ferromagnetic electrodes are parallel.

19. The spin-valve device of claim 18, wherein
the first ferromagnetic electrode is formed of LSMO and the second ferromagnetic electrode is formed of a Co and Al alloy;
the π-conjugated organic semiconductor spacer layer is formed from AlQ$_3$ and is at least 100 nanometers thick; and
the first and second ferromagnetic electrodes and π-conjugated organic semiconductor spacer layer are configured to show a magnetoresistance effect, quantified as a percentage of a ratio of change in resistance to device resistance, transitions from a range of about 14 to 9 to a range of about 3 to 0 for magnetic field values between about −0.5 and −0.25 Oersted and magnetic field values between about 0.25 and 0.5 Oersted, when the percentage of the ratio of change in resistance to device resistance is measured at about 11.5° K, with a current of about −0.1 μA, under a voltage of about 0.74 mV.

20. The spin-valve device of claim 16, wherein the device exhibits a magnetoresistance effect that, when measured as a percentage of Δ resistance to resistance at about 11.5° K, with a current of about −0.1 μA, under a voltage of about 0.74 mV, is within about 4 to 0 for magnetic field values from about −0.25 Oersted to about 0.25 Oersted.

* * * * *